US012564038B2

(12) United States Patent
Wang et al.

(10) Patent No.: US 12,564,038 B2
(45) Date of Patent: Feb. 24, 2026

(54) THIN FILM TRANSISTOR ARRAY SUBSTRATE, MANUFACTURING METHOD, AND DISPLAY PANEL

(71) Applicant: Shenzhen China Star Optoelectronics Semiconductor Display Technology Co., Ltd., Guangdong (CN)

(72) Inventors: Xinghua Wang, Guangdong (CN); Qiankun Xu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 364 days.

(21) Appl. No.: 18/239,156

(22) Filed: Aug. 29, 2023

(65) Prior Publication Data

US 2024/0222265 A1     Jul. 4, 2024

(30) Foreign Application Priority Data

Dec. 30, 2022    (CN) .......................... 202211735554.7

(51) Int. Cl.
| | |
|---|---|
| *H01L 23/522* | (2006.01) |
| *H10D 30/67* | (2025.01) |
| *H10D 99/00* | (2025.01) |

(52) U.S. Cl.
CPC ...... *H01L 23/5225* (2013.01); *H01L 23/5226* (2013.01); *H10D 30/6723* (2025.01); *H10D 99/00* (2025.01); *H10D 30/6755* (2025.01)

(58) Field of Classification Search
CPC ............ H01L 23/5225; H01L 23/5226; H10D 30/6723; H10D 99/00; H10D 30/6755; H10D 86/441; H10D 86/60; H10D 86/0223; H10D 86/451; H10D 86/423
See application file for complete search history.

(56) References Cited

U.S. PATENT DOCUMENTS

| | | | | |
|---|---|---|---|---|
| 2021/0036029 A1* | 2/2021 | Park | ..................... | H10D 86/431 |
| 2021/0296365 A1* | 9/2021 | Liu | .................... | H10D 86/0231 |
| 2021/0327920 A1* | 10/2021 | Zhou | ..................... | H10D 86/60 |
| 2021/0376160 A1* | 12/2021 | Luo | .................... | H10D 30/6741 |
| 2022/0140149 A1* | 5/2022 | Luo | ......................... | H10D 99/00 |
| | | | | 257/288 |
| 2022/0173128 A1* | 6/2022 | Kim | ................... | H10D 30/6739 |
| 2023/0052154 A1* | 2/2023 | Wang | ................. | H10K 59/1213 |
| 2023/0253410 A1* | 8/2023 | Zhang | .................... | H10D 86/00 |
| | | | | 257/204 |
| 2024/0030223 A1* | 1/2024 | Lu | ........................ | H10D 86/421 |
| 2024/0030225 A1* | 1/2024 | Chen | ................. | H10D 30/6755 |
| 2024/0047466 A1* | 2/2024 | Tan | ..................... | H10D 86/451 |

(Continued)

*Primary Examiner* — Victor A Mandala

(57) ABSTRACT

A thin film transistor array substrate includes a base substrate, a light shielding layer, a semiconductor layer, a gate insulating layer, a gate layer, and a source-drain metal layer in contact with the semiconductor layer and in contact with the light shielding layer sequentially disposed on the base substrate, a first insulating layer covering the source-drain metal layer disposed on the base substrate, and a metal protection layer disposed on the first insulating layer. The semiconductor layer, the gate layer, and the source-drain metal layer form a thin film transistor. An end of the metal protection layer is in contact with the source-drain metal layer, and another end of the metal protection layer is in contact with the light shielding layer.

20 Claims, 5 Drawing Sheets

(56)                References Cited

U.S. PATENT DOCUMENTS

| | | | |
|---|---|---|---|
| 2024/0063230 A1* | 2/2024 | Luo | H10D 30/6723 |
| 2024/0178240 A1* | 5/2024 | Ma | H10D 86/021 |
| 2024/0194748 A1* | 6/2024 | Luo | H10H 20/857 |
| 2024/0196694 A1* | 6/2024 | Hu | H10K 59/124 |
| 2024/0213259 A1* | 6/2024 | Luo | H10D 86/423 |
| 2024/0290889 A1* | 8/2024 | Lu | H10D 30/6755 |

* cited by examiner

THIN FILM TRANSISTOR ARRAY SUBSTRATE, MANUFACTURING METHOD, AND DISPLAY PANEL

CROSS REFERENCE TO RELATED APPLICATIONS

This application claims priority to Chinese Patent Application No. 202211735554.7, filed on Dec. 30, 2022, and entitled "THIN FILM TRANSISTOR ARRAY SUBSTRATE, MANUFACTURING METHOD, AND DISPLAY PANEL". The entire disclosures of the above application are incorporated herein by reference.

TECHNICAL FIELD

The present application relates to the field of display technology, in particular to a thin film transistor array substrate, a manufacturing method, and a display panel.

BACKGROUND

With the continuous development of display technology, people have higher and higher requirements on display performances of display devices. A display device includes a display panel. The display panel includes a pixel circuit configured to drive light emitting devices to emit light. The pixel circuit is usually composed of a plurality of thin film transistors (TFTs). In a current manufacturing process of a TFT array substrate, a protective layer is formed during the manufacturing process of the TFT array substrate, but the protective layer only acts as an anti-oxidation function of the TFT array substrate.

SUMMARY OF INVENTION

The present application provides a thin film transistor array substrate, a manufacturing method, and a display panel, which can reduce an interference of an external circuit on a wiring of a thin film transistor itself while preventing oxidation and improve stability of the array substrate.

In an aspect, the present application provides a thin film transistor array substrate including a base substrate, a light shielding layer, a semiconductor layer, a gate insulating layer, a gate layer, and a source-drain metal layer in contact with the semiconductor layer and in contact with the light shielding layer sequentially disposed on the base substrate, wherein the semiconductor layer, the gate layer, and the source-drain metal layer form a thin film transistor;

a first insulating layer covering the source-drain metal layer disposed on the base substrate, and a metal protection layer disposed on the first insulating layer, wherein an end of the metal protection layer is in contact with the source-drain metal layer, and another end of the metal protection layer is in contact with the light shielding layer.

In a possible implementation of the present application, the first insulating layer is provided with a first contact hole exposing the source-drain metal layer, and the metal protection layer is in contact with the source-drain metal layer through the first contact hole.

In a possible implementation of the present application, the thin film transistor array substrate further includes a buffer layer disposed on the base substrate, disposed between the light shielding layer and the semiconductor layer, and covering the light shielding layer.

In a possible implementation of the present application, the thin film transistor array substrate further includes a second insulating layer disposed on the base substrate and simultaneously covering the semiconductor layer, the gate insulating layer, the gate layer, and the buffer layer.

In a possible implementation of the present application, the buffer layer, the second insulating layer, and the first insulating layer are provided with a second contact hole, and the metal protection layer is in contact with the light shielding layer through the second contact hole.

In a possible implementation of the present application, the buffer layer and the second insulating layer are provided with a third contact hole exposing the light shielding layer, and the source-drain metal layer is in contact with the light shielding layer through the third contact hole.

In a possible implementation of the present application, the base substrate is provided with a planarization layer on the first insulating layer and the metal protection layer.

In a possible implementation of the present application, the base substrate is provided with a fourth contact hole exposing the metal protection layer on the planarization layer, and the base substrate is provided with an electrode layer in contact with the metal protection layer on the planarization layer and in the fourth contact hole.

In a possible implementation of the present application, the source-drain metal layer, the light shielding layer, and the metal protection layer form a circuit loop.

In another aspect, the present application provides a method of manufacturing a thin film transistor array substrate including:

providing a base substrate;

sequentially preparing a patterned light shielding layer, a semiconductor layer, a gate insulating layer, a gate layer, and a source-drain metal layer in contact with the semiconductor layer and the patterned light shielding layer on the base substrate, wherein the semiconductor layer, the gate layer, and the source-drain metal layer form a thin film transistor;

preparing a first insulating layer covering the source-drain metal layer on the base substrate; and preparing a patterned metal protection layer on the first insulating layer, wherein an end of the patterned metal protection layer is in contact with the source-drain metal layer, and another end of the patterned metal protection layer is in contact with the light shielding layer.

In another aspect, the present application provides a display panel including the thin film transistor array substrate or the thin film transistor array substrate prepared by the method of manufacturing the thin film transistor array substrate.

In the present application, the semiconductor layer, the gate layer, and the source-drain metal layer of the array substrate together constitute a thin film transistor. The source-drain metal layer of the array substrate is in contact with the light shielding layer, and a first insulating layer covering both the first metal layer and the source-drain metal layer is provided on the base substrate. A metal protection layer is arranged on the first insulating layer, and one end of the metal protection layer is in contact with the source-drain metal layer, and another end of the metal protection layer is in contact with the light shielding layer. This makes the source-drain metal layer, the light shielding layer, and the metal protection layer together form a circuit loop. Therefore, the metal protection layer of the array substrate in the present application not only plays an anti-oxidation role. The circuit loop formed by the source-drain metal layer, the light shielding layer, and the metal protective layer can also shield the interference of the external circuit to the thin film transistor, so that the working state of the array substrate is more stable. Moreover, the designed structure of the thin film transistor array substrate of the present application can be obtained without affecting the original manufacturing steps of the thin film transistor array substrate and may not cause additional manufacturing costs. That is, while optimizing the circuit wiring of the thin film transistor array substrate, the preparation cost is saved.

BRIEF DESCRIPTION OF THE DRAWINGS

In order to illustrate the technical solutions more clearly in the embodiments of the present application, the following briefly introduces the drawings that need to be used in the description of the embodiments. Obviously, the drawings in the following description are only some embodiments of the present invention. For those skilled in the art, other drawings can also be obtained based on these drawings without any creative effort.

DETAILED DESCRIPTION OF ILLUSTRATED EMBODIMENTS

The technical solutions in the embodiments of the present application will be clearly and completely described below in conjunction with the drawings in the embodiments of the present application. Apparently, the described embodiments are only some of the embodiments of the present invention, but not all of them. Based on the embodiments of the present invention, all other embodiments obtained by those skilled in the art without creative efforts fall within the protection scope of the present invention.

In the description of the present invention, it should be understood that the terms "first" and "second" are used for description purposes only and cannot be interpreted as indicating or implying relative importance or implicitly indicating the quantity of indicated technical features. Thus, a feature defined as "first" or "second" may explicitly or implicitly include one or more of said features. In the description of the present invention, "plurality" means two or more, unless otherwise specifically defined.

In this application, the word "exemplary" is used to mean "serving as an example, illustration, or explanation". Any embodiment described in this application as "exemplary" is not necessarily to be construed as preferred or advantageous over other embodiments. The following description is given to enable any person skilled in the art to make and use the invention. In the following description, details are set forth for purposes of explanation. It should be understood that one of ordinary skill in the art would recognize that the present invention may be practiced without the use of these specific details. In other instances, well-known structures and procedures are not described in detail to avoid obscuring the description of the present invention with unnecessary detail. Thus, the present invention is not intended to be limited to the embodiments shown but is to be accorded the widest scope consistent with the principles and features disclosed in this application.

Embodiments of the present application provide a thin film transistor array substrate, a manufacturing method, and a display panel, which will be described in detail below.

Figure 1:
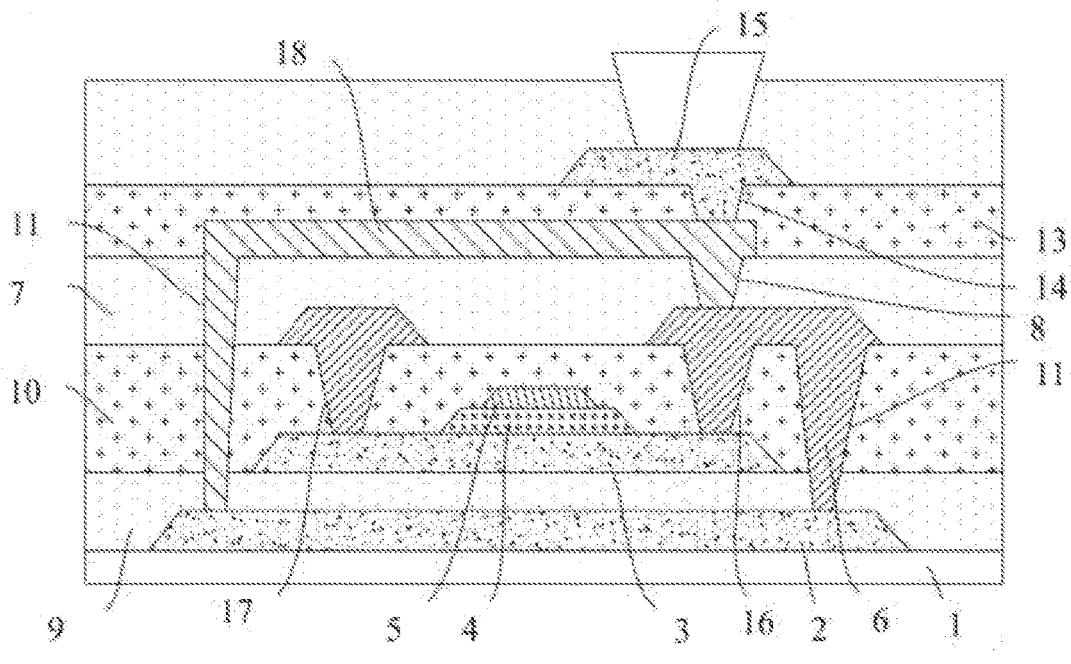
FIG. 1 is a schematic structural diagram of an embodiment of a thin film transistor array substrate provided in an embodiment of the present application.
Figure 2:
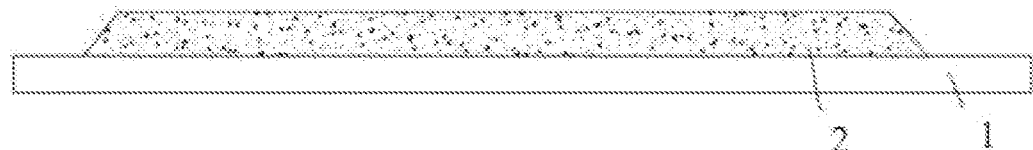
FIG. 2 is a schematic structural diagram during a manufacturing process of a method of manufacturing a thin film transistor array substrate provided in the embodiment of the present application.
Figure 3:
FIG. 3 is a schematic structural diagram during a manufacturing process of a method of manufacturing a thin film transistor array substrate provided in an embodiment of the present application.
Figure 4:
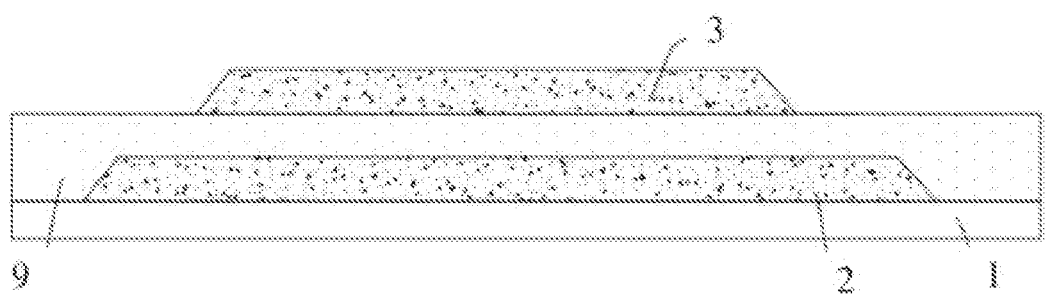
FIG. 4 is a schematic structural diagram during a manufacturing process of a method of manufacturing a thin film transistor array substrate provided in an embodiment of the present application.
Figure 5:
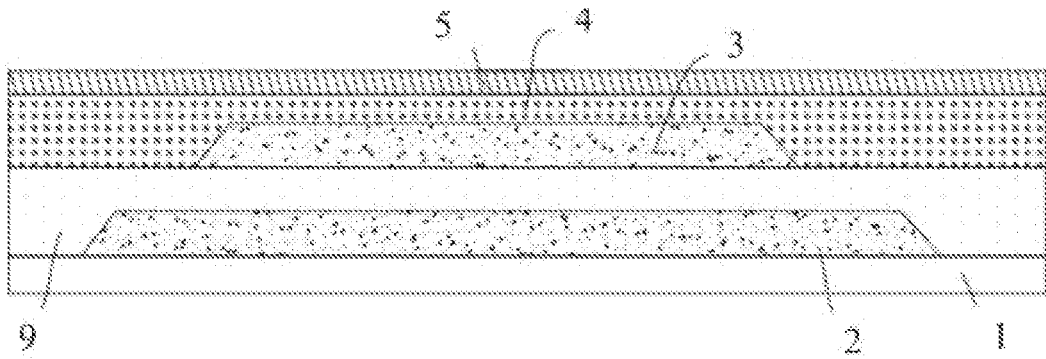
FIG. 5 is a schematic structural diagram during a manufacturing process of a method of manufacturing a thin film transistor array substrate provided in an embodiment of the present application.
Figure 6:
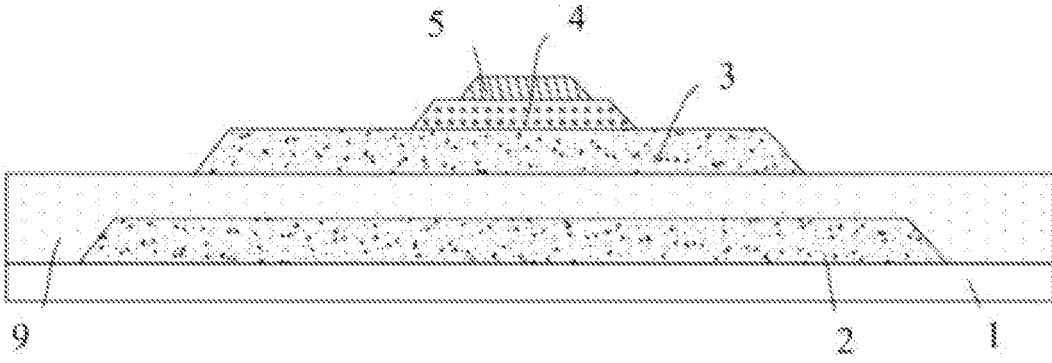
FIG. 6 is a schematic structural diagram during a manufacturing process of a method of manufacturing a thin film transistor array substrate provided in an embodiment of the present application.
Figure 7:
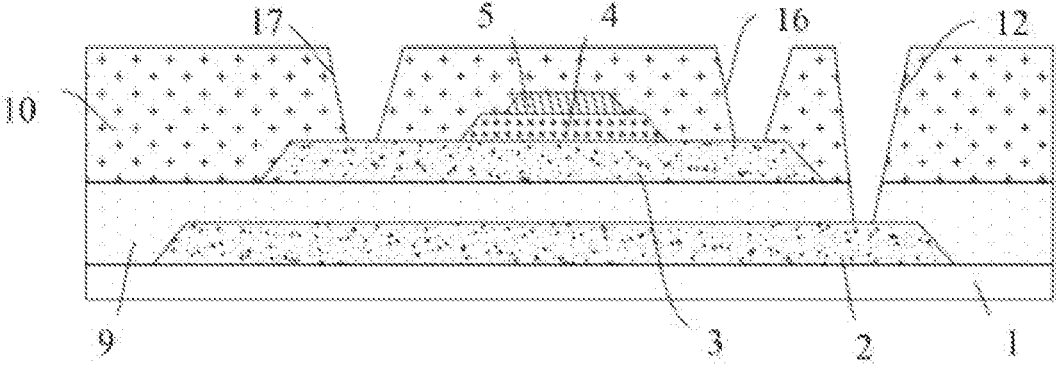
FIG. 7 is a schematic structural diagram during a manufacturing process of a method of manufacturing a thin film transistor array substrate provided in the embodiment of the present application.
Figure 8:
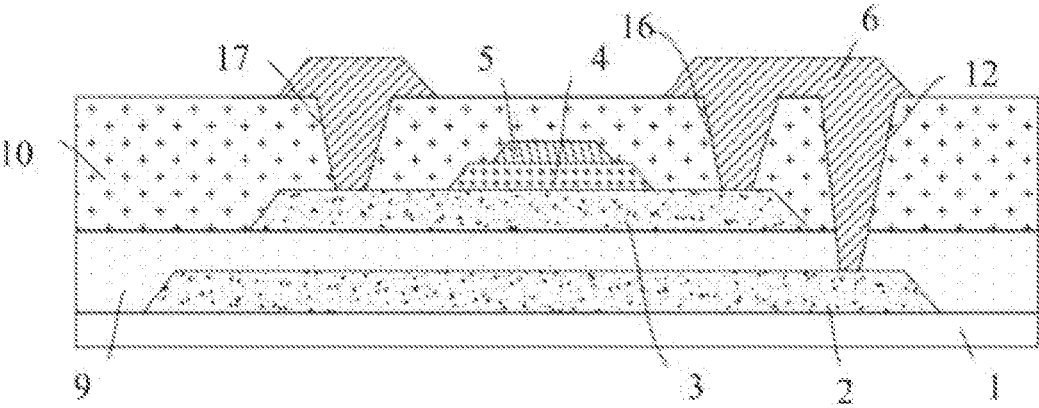
FIG. 8 is a schematic structural diagram during a manufacturing process of a method of manufacturing a thin film transistor array substrate provided in the embodiment of the present application.
Figure 9:
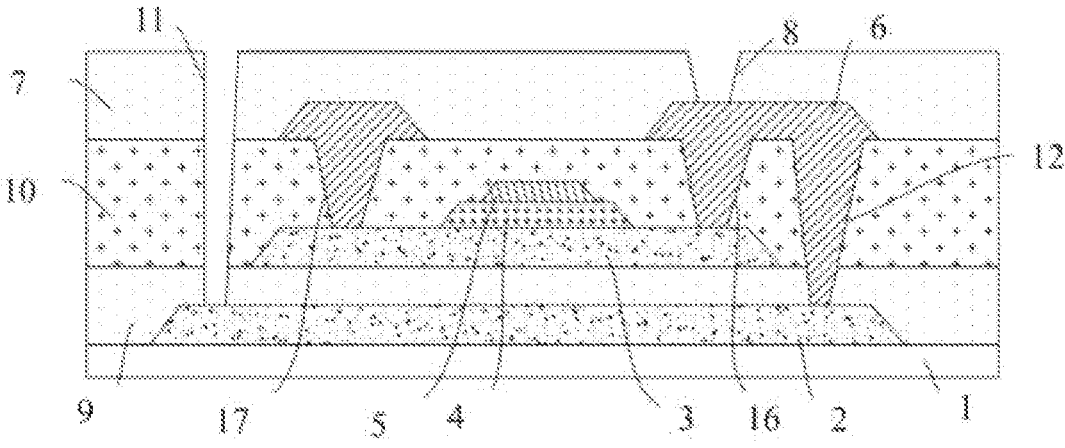
FIG. 9 is a schematic structural diagram during a manufacturing process of a method of manufacturing a thin film transistor array substrate provided in the embodiment of the present application.
Figure 10:
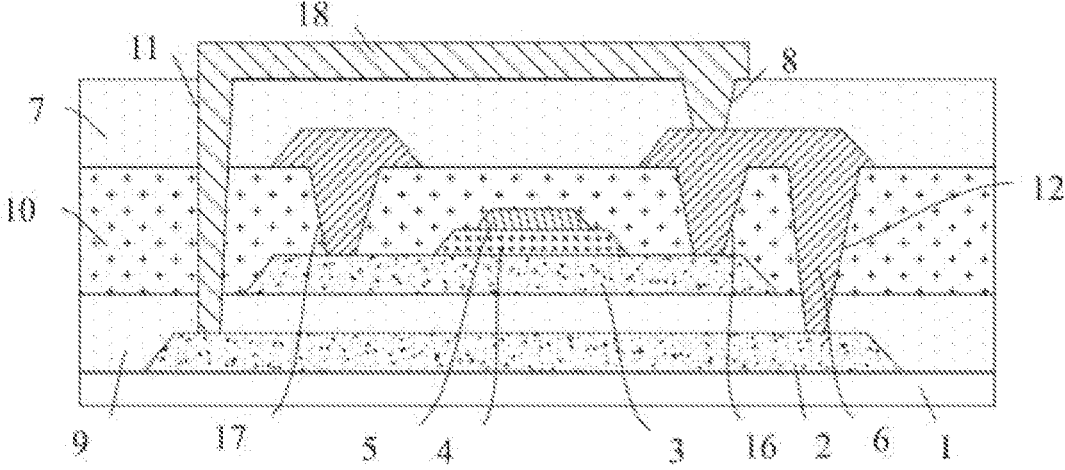
FIG. 10 is a schematic structural diagram during a manufacturing process of a method of manufacturing a thin film transistor array substrate provided in the embodiment of the present application.
Figure 11:
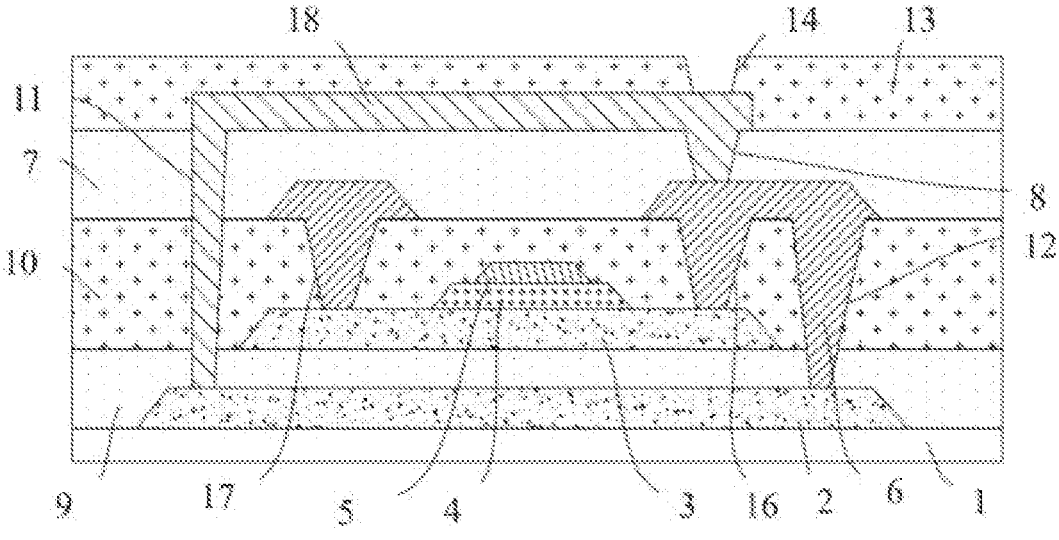
FIG. 11 is a schematic structural diagram during a manufacturing process of a method of manufacturing a thin film transistor array substrate provided in the embodiment of the present application.
Figure 12:
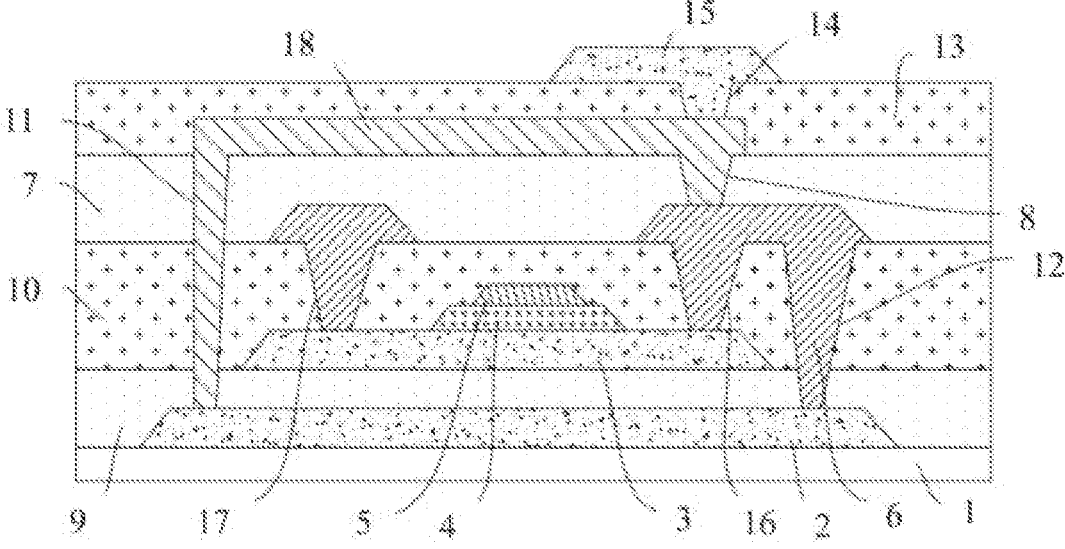
FIG. 12 is a schematic structural diagram during a manufacturing process of a method of manufacturing a thin film transistor array substrate provided in the embodiment of the present application.

FIG. 1 is a schematic structural diagram of an embodiment of a thin film transistor array substrate provided in an embodiment of the present application. The thin film transistor array substrate includes:

a base substrate 1, a light shielding layer 2, a semiconductor layer 3, a gate insulating layer 4, a gate layer 5, and a source-drain metal layer 6 in contact with the semiconductor layer 3 and in contact with the light shielding layer 2 sequentially disposed on the base substrate 1, wherein the semiconductor layer 3, the gate layer 5, and the source-drain metal layer 6 form a thin film transistor;

a first insulating layer 7 covering the source-drain metal layer 6 disposed on the base substrate 1, and a metal protection layer 18 disposed on the first insulating layer 7, wherein an end of the metal protection layer 18 is in contact with the source-drain metal layer 6, and another end of the metal protection layer 18 is in contact with the light shielding layer 2.

In the present application, the semiconductor layer 3, the gate layer 5, and the source-drain metal layer 6 of the array substrate together constitute a thin film transistor. The source-drain metal layer 6 of the array substrate is in contact with the light shielding layer 2, and a first insulating layer 7 covering both the first metal layer and the source-drain metal layer 6 is provided on the base substrate 1. A metal protection layer 18 is arranged on the first insulating layer 7, and one end of the metal protection layer 18 is in contact with the source-drain metal layer 6, and another end of the metal protection layer 18 is in contact with the light shielding layer 2. This makes the source-drain metal layer 6, the light shielding layer 2, and the metal protection layer 18 together form a circuit loop. Therefore, the metal protection layer 18 of the array substrate in the present application not only plays an anti-oxidation role. The circuit loop formed by the source-drain metal layer 6, the light shielding layer 2, and the metal protective layer 18 can also shield the interference of the external circuit to the thin film transistor, so that the working state of the array substrate is more stable. Moreover, the designed structure of the thin film transistor array substrate of the present application can be obtained without affecting the original manufacturing steps of the thin film transistor array substrate and may not cause additional manufacturing costs. That is, while optimizing the circuit wiring of the thin film transistor array substrate, the preparation cost is saved.

The base substrate 1 may be a glass substrate or a plastic substrate. In this embodiment, specifically, the base substrate 1 may be a light transmitting substrate or an opaque/reflective substrate. The material of the light transmitting substrate can be selected from glass, quartz, organic polymer, other suitable materials, or combinations thereof. The material of the opaque/reflective substrate can be selected from conductive materials, metals, wafers, ceramics, other suitable materials, or combinations thereof. It should be noted that if the base substrate 1 is made of a conductive material, before the base substrate 1 is loaded with other structural layers of the array substrate, an insulating layer (not shown) is formed on the base substrate 1 to avoid short circuit between the base substrate 1 and other structural layers of the array substrate. In terms of mechanical properties, the base substrate 1 can be a rigid substrate or a flexible substrate. The material of the rigid substrate may be selected from glass, quartz, conductive material, metal, wafer, ceramic, other suitable materials, or combinations thereof. The material of the flexible substrate can be selected from ultra-thin glass, organic polymers such as plastics, other suitable materials, or combinations thereof, which are not specifically limited in this embodiment.

The light shielding layer 2 is disposed on a side of the base substrate 1. In this embodiment, the light shielding layer 2 may be a colored monolithic metal oxide, or a composite metal oxide, for example, non-ferrous metal oxides such as chromium oxide and titanium oxide and their composite oxides. In this embodiment, the thickness of the light shielding layer 2 may be 50 nm to 200 nm as required. According to an embodiment, in the case where the light shielding layer 2 is made of a colored monolithic metal oxide or a composite metal oxide, the light shielding layer 2 can be formed on the base substrate 1 by electron beam evaporation, sputtering, and other techniques. This is not specifically limited.

The semiconductor layer 3 is disposed on a side of the base substrate 1 where the light shielding layer 2 is located. The semiconductor layer 3 constitutes the active layer of the thin film transistor. In this embodiment, the semiconductor layer 3 can be a metal oxide semiconductor, such as indium gallium zinc oxide (IGZO), tin oxide (ZnO), indium zinc oxide (IZO), hafnium indium zinc oxide (HIZO), indium gallium oxide (IGO), cadmium oxide, germanium oxide (2CdO·GeO2), nickel cobalt oxide (NiCo2O4), etc., are not limited thereto. In other embodiments, the material of the semiconductor layer 3 may also be amorphous silicon, single crystal silicon, polycrystalline silicon, or other suitable materials, which are not specifically limited in this embodiment.

The gate insulating layer 4 is disposed on the side of the base substrate 1 where the light shielding layer 2 is located. In this embodiment, the gate insulating layer 4 can be an inorganic material, such as silicon oxide, silicon nitride or silicon oxynitride, an organic material, or a combination of the above materials, which is not specifically limited in this embodiment.

The gate layer 5 is disposed on the side of the base substrate 1 where the light shielding layer 2 is located. The gate layer 5 is disposed on the gate insulating layer 4 and overlapped with the gate insulating layer 4. In this embodiment, the gate layer 5 may be a metal material. The gate layer 5 can also be made of other conductive materials. Exemplarily, the gate layer 5 may be an alloy, a nitride of a metal material, an oxide of a metal material, an oxynitride of a metal material, or a combination thereof, which is not specifically limited in this embodiment.

The source-drain metal layer 6 includes a source metal layer for setting the source and a drain metal layer for setting the drain. The source metal layer and the drain metal layer respectively correspond to the source and the drain arranged at intervals between the two ends of the semiconductor layer 3. In this embodiment, the source-drain metal layer 6 may be a metal material, and the source-drain metal layer 6 may also be other conductive materials. Exemplarily, the source-drain metal layer 6 may be an alloy, a nitride of a metal material, an oxide of a metal material, an oxynitride of a metal material, or a combination thereof, which is not specifically limited in this embodiment.

In one embodiment of the present application, the first insulating layer 7 is provided with a first contact hole 8 exposing the source-drain metal layer 6, and the metal protection layer 18 is in contact with the source-drain metal layer 6 through the first contact hole 8.

In one embodiment of the present application, a buffer layer 9 covering the light shielding layer 2 is disposed on the base substrate 1 between the light shielding layer 2 and the semiconductor layer 3. In this embodiment, the buffer layer 9 is used to buffer the stress received during the preparation of the thin film transistor array substrate, so as to avoid damage or cracking of the thin film transistor array substrate. The buffer layer 9 may be a silicon oxide layer, a silicon nitride layer, a silicon oxynitride layer, or a combination thereof, which is not specifically limited in this embodiment.

In one embodiment of the present application, a second insulating layer 10 covering the semiconductor layer 3, the gate insulating layer 4, the gate layer 5, and the buffer layer 9 is disposed on the base substrate 1. In this embodiment, the second insulating layer 10 may be an alloy, a nitride of a metal material, an oxide of a metal material, an oxynitride of a metal material, or a combination thereof, which is not specifically limited in this embodiment.

In one embodiment of the present application, the buffer layer 9, the second insulating layer 10, and the first insulating layer 7 jointly define a second contact hole 11, and the metal protection layer 18 contacts the light shielding layer 2 through the second contact hole 11.

In one embodiment of the present application, the buffer layer 9 and the second insulating layer 10 jointly define a third contact hole 12 exposing the light-shielding layer 2, and the source-drain metal layer 6 is in contact with the light shielding layer 2 through the third contact hole 12.

In one embodiment of the present application, the base substrate 1 is provided with a planarization layer 13 on the first insulating layer 7 and the metal protection layer 18. The planarization layer 13 is used to improve the flatness of the thin film transistor array substrate, so as to make the surface of the thin film transistor array substrate flatter. The planarization layer 13 may be an inorganic material, specifically polyimide (PI), or other materials, which is not specifically limited in this embodiment.

In one embodiment of the present application, the base substrate 1 defines a fourth contact hole 14 exposing the metal protection layer 18 on the planarization layer 13. The base substrate 1 is jointly provided with an electrode layer 15 in contact with the metal protection layer 18 on the planarization layer 13 and in the fourth contact hole 14.

In one embodiment of the present application, the second insulating layer 10 is provided with a fifth contact hole 16 and a sixth contact hole 17 exposing the semiconductor layer 3. The source-drain metal layer 6 is in contact with the semiconductor layer 3 through the fifth contact hole 16 and the sixth contact hole 17.

In one embodiment of the present application, the present application provides a method of manufacturing a thin film transistor array substrate, comprising the following operations:

Provide a base substrate 1;

Sequentially prepare a patterned light shielding layer 2, a semiconductor layer 3, a gate insulating layer 4, a gate layer 5, and a source-drain metal layer 6 in contact with the semiconductor layer 3 and the patterned light shielding layer 2 on the base substrate 1, wherein the semiconductor layer 3, the gate layer 5, and the source-drain metal layer 6 form a thin film transistor;

Prepare a first insulating layer 7 covering the source-drain metal layer 6 on the base substrate 1; and Prepare a patterned metal protection layer 18 on the first insulating layer 7, wherein an end of the patterned metal protection layer 18 is in contact with the source-drain metal layer 6, and another end of the patterned metal protection layer 18 is in contact with the light shielding layer 2.

In this embodiment, as shown in FIG. 2 to FIG. 12, the method of manufacturing a thin film transistor array substrate specifically includes the following operations 101-1013:

Operation 101: Provide a base substrate 1, wherein the base substrate 1 may be a glass substrate;

Operation 102: Deposit a layer of a first metal layer on the glass, and pattern the first metal layer by using a yellow light and etching, and use the patterned first metal layer as a light shielding layer 2;

Operation 103: Deposit an entire buffer layer 9 on a base substrate 1 with the patterned light-shielding layer 2;

Operation 104: Deposit a layer of a first metal oxide on the base substrate 1 deposited with the buffer layer 9, and etch the first metal oxide for patterning, so as to obtain a semiconductor layer 3;

The first metal oxide is deposited using physical vapor sputtering. The first metal oxide is indium gallium zinc oxide (IGZO). The IGZO is patterned by photolithography, and the IGZO pattern can be formed by wet etching. The oxalic acid-based chemical solution can be used as an etchant. After the photoresist is stripped, the IGZO is conductorized by plasma treatment to form the semiconductor layer 3, that is, the active layer.

Operation 105: Deposit a gate insulating layer 4, and then deposit a gate layer 5;

Operation 106: Use a yellow light process to etch the pattern of the gate layer 5, dry-etch the pattern of the gate insulating layer 4, and complete the conductorization of the semiconductor layer 3;

Operation 107: Obtain a second insulating layer 10 by using yellow light and dry etching processes and complete the patterning, and open holes on the second insulating layer 10 and the buffer layer 9 to obtain a third contact hole 12, a fifth contact hole 16, a the sixth contact hole 17;

Operation 108: Deposit the source-drain metal layer 6 and etch out a pattern, wherein the semiconductor layer 3, the gate layer 5, and the source-drain metal layer 6 together form a thin film transistor;

The source-drain metal layer 6 is deposited by a physical vapor phase method. A pattern of the source-drain metal layer 6 is formed through a photolithography process. The hydrogen peroxide-based chemical solution is used as an etchant for the metal material to form the source-drain metal layer 6.

Operation 109: Deposit the first insulating layer 7 and complete patterning, open a hole on the first insulating layer 7 to obtain a first contact hole 8, and open holes together on the first insulating layer 7, the second insulating layer 10, and the buffer layer 9 to obtain a second contact hole 11;

Operation 110: Deposit a metal protection layer 18 and complete the patterning;

Operation 111: Deposit a planarization layer 13, and open a hole on the first insulating layer 7 to obtain a fourth contact hole 14;

Operation 112: Form an electrode layer 15 by physical deposition and complete the patterning;

Operation 113: After the Bank is coated, a pixel definition area is made by PHO&DEV, and finally the thin film transistor array substrate is obtained.

The application adopts the above manufacturing operations, the semiconductor layer 3, the gate layer 5, and the source-drain metal layer 6 of the array substrate together constitute a thin film transistor. The source-drain metal layer 6 of the array substrate is in contact with the light shielding layer 2, and a first insulating layer 7 covering both the first metal layer and the source-drain metal layer 6 is provided on the base substrate 1. A metal protection layer 18 is arranged on the first insulating layer 7, and one end of the metal protection layer 18 is in contact with the source-drain metal layer 6, and another end of the metal protection layer 18 is in contact with the light shielding layer 2. This makes the source-drain metal layer 6, the light shielding layer 2, and the metal protection layer 18 together form a circuit loop. Therefore, the metal protection layer 18 of the array substrate in the present application not only plays an anti-oxidation role. The circuit loop formed by the source-drain metal layer 6, the light shielding layer 2, and the metal protective layer 18 can also shield the interference of the external circuit to the thin film transistor, so that the working state of the array substrate is more stable. Moreover, the designed structure of the thin film transistor array substrate of the present application can be obtained without affecting the original manufacturing steps of the thin film transistor array substrate and may not cause additional manufacturing costs. That is, while optimizing the circuit wiring of the thin film transistor array substrate, the preparation cost is saved.

In one embodiment of the present application, the present application provides a display panel including the thin film transistor array substrate or the thin film transistor array substrate prepared by the method of manufacturing the thin film transistor array substrate.

A thin film transistor array substrate, a manufacturing method, and a display panel provided in the embodiments of the present application have been introduced in detail above. In the descriptions, specific examples are used to illustrate the principle and implementation of the present invention. The descriptions of the above embodiments are only used to help understand the method and core idea of the present invention. In addition, for those skilled in the art, according to the concept of the present invention, there will be changes in the specific implementation and application range. In summary, the contents of this specification should not be construed as limiting the present invention.

What is claimed is:

1. A thin film transistor array substrate, comprising:
a base substrate;
a light shielding layer, a semiconductor layer, a gate insulating layer, a gate layer, and a source-drain metal layer in contact with the semiconductor layer and in contact with the light shielding layer sequentially disposed on the base substrate, wherein the semiconductor layer, the gate layer, and the source-drain metal layer form a thin film transistor;
a first insulating layer covering the source-drain metal layer disposed on the base substrate; and
a metal protection layer disposed on the first insulating layer, wherein an end of the metal protection layer is in contact with the source-drain metal layer, and another end of the metal protection layer is in contact with the light shielding layer.

2. The thin film transistor array substrate according to claim 1, wherein the first insulating layer is provided with a first contact hole exposing the source-drain metal layer, and the metal protection layer is in contact with the source-drain metal layer through the first contact hole.

3. The thin film transistor array substrate according to claim 1, further comprising a buffer layer disposed on the base substrate, disposed between the light shielding layer and the semiconductor layer, and covering the light shielding layer.

4. The thin film transistor array substrate according to claim 3, further comprising a second insulating layer disposed on the base substrate and simultaneously covering the semiconductor layer, the gate insulating layer, the gate layer, and the buffer layer.

5. The thin film transistor array substrate according to claim 4, wherein the buffer layer, the second insulating layer, and the first insulating layer are provided with a second contact hole, and the metal protection layer is in contact with the light shielding layer through the second contact hole.

6. The thin film transistor array substrate according to claim 5, wherein the buffer layer and the second insulating layer are provided with a third contact hole exposing the light shielding layer, and the source-drain metal layer is in contact with the light shielding layer through the third contact hole.

7. The thin film transistor array substrate according to claim 1, wherein the base substrate is provided with a planarization layer on the first insulating layer and the metal protection layer.

8. The thin film transistor array substrate according to claim 7, wherein the base substrate is provided with a fourth contact hole exposing the metal protection layer on the planarization layer, and the base substrate is provided with an electrode layer in contact with the metal protection layer on the planarization layer and in the fourth contact hole.

9. The thin film transistor array substrate according to claim 1, wherein the source-drain metal layer, the light shielding layer, and the metal protection layer form a circuit loop.

10. A method of manufacturing a thin film transistor array substrate, comprising:
providing a base substrate;
sequentially preparing a patterned light shielding layer, a semiconductor layer, a gate insulating layer, a gate layer, and a source-drain metal layer in contact with the semiconductor layer and the patterned light shielding layer on the base substrate, wherein the semiconductor layer, the gate layer, and the source-drain metal layer form a thin film transistor;
preparing a first insulating layer covering the source-drain metal layer on the base substrate; and
preparing a patterned metal protection layer on the first insulating layer, wherein an end of the patterned metal protection layer is in contact with the source-drain metal layer, and another end of the patterned metal protection layer is in contact with the light shielding layer.

11. The method of manufacturing the thin film transistor array substrate according to claim 10, wherein the source-drain metal layer, the light shielding layer, and the metal protection layer form a circuit loop.

12. A display panel, comprising:
a thin film transistor array substrate, comprising:
a base substrate;
a light shielding layer, a semiconductor layer, a gate insulating layer, a gate layer, and a source-drain metal layer in contact with the semiconductor layer and in contact with the light shielding layer sequentially disposed on the base substrate, wherein the semiconductor layer, the gate layer, and the source-drain metal layer form a thin film transistor;
a first insulating layer covering the source-drain metal layer disposed on the base substrate; and
a metal protection layer disposed on the first insulating layer, wherein an end of the metal protection layer is in contact with the source-drain metal layer, and another end of the metal protection layer is in contact with the light shielding layer.

13. The display panel according to claim 12, wherein the first insulating layer is provided with a first contact hole exposing the source-drain metal layer, and the metal protection layer is in contact with the source-drain metal layer through the first contact hole.

14. The display panel according to claim 12, wherein the thin film transistor array substrate further comprises a buffer layer disposed on the base substrate, disposed between the light shielding layer and the semiconductor layer, and covering the light shielding layer.

15. The display panel according to claim 12, wherein the thin film transistor array substrate further comprises a second insulating layer disposed on the base substrate and simultaneously covering the semiconductor layer, the gate insulating layer, the gate layer, and the buffer layer.

16. The display panel according to claim 15, wherein the buffer layer, the second insulating layer, and the first insulating layer are provided with a second contact hole, and the metal protection layer is in contact with the light shielding layer through the second contact hole.

17. The display panel according to claim 16, wherein the buffer layer and the second insulating layer are provided with a third contact hole exposing the light shielding layer, and the source-drain metal layer is in contact with the light shielding layer through the third contact hole.

18. The display panel according to claim 12, wherein base substrate is provided with a planarization layer on the first insulating layer and the metal protection layer.

19. The display panel according to claim 18, wherein the base substrate is provided with a fourth contact hole exposing the metal protection layer on the planarization layer, and the base substrate is provided with an electrode layer in contact with the metal protection layer on the planarization layer and in the fourth contact hole.

20. The display panel according to claim 12, wherein the source-drain metal layer, the light shielding layer, and the metal protection layer form a circuit loop.

*     *     *     *     *